United States Patent
Chyan et al.

(10) Patent No.: US 6,274,490 B1
(45) Date of Patent: Aug. 14, 2001

(54) METHOD OF MANUFACTURING SEMICONDUCTOR DEVICES HAVING HIGH PRESSURE ANNEAL

(75) Inventors: Yih-Feng Chyan; Yi Ma, both of Orlando, FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/521,268

(22) Filed: Mar. 8, 2000

(51) Int. Cl.[7] .................................................. H01L 21/44
(52) U.S. Cl. .......................... 438/663; 438/778; 257/565
(58) Field of Search .................................. 438/35, 36, 37, 438/38, 308, 597, 663, 664, 778, 787, 791; 257/607–712, 565, 588

(56) References Cited

U.S. PATENT DOCUMENTS

| | | | |
|---|---|---|---|
| 5,972,765 | * 10/1999 | Clark et al. | 438/308 |
| 5,982,020 | * 11/1999 | Kizilyalli | 257/565 |
| 6,071,751 | * 6/2000 | Wallace et al. | 438/38 |
| 6,077,791 | * 6/2000 | DeTar | 438/778 |

* cited by examiner

Primary Examiner—David Nelms
Assistant Examiner—Dung A Le

(57) ABSTRACT

The present invention provides a method of passivating a semiconductor device having a capping layer formed thereover, comprising: (1) subjecting the semiconductor device to a high pressure within a pressure chamber and (2) exposing the semiconductor device to a passivating gas. The high pressure causes the passivating gas, such as a deuterated passivating gas, to penetrate the capping layer and thereby passivate the semiconductor device. The method provided by the present invention is, therefore, particularly useful in those instances where a final passivation step is desired after the formation of the capping layer. It is believed that the hydrogen isotope bonds to dangling bond sites within the semiconductor device, which are most often present at a silicon/silicon dioxide interface. Further, because of their larger mass, these hydrogen isotope atoms are not easily removed by electron flow during the operation of the device as is the case with the lighter hydrogen atoms.

24 Claims, 2 Drawing Sheets

METHOD OF MANUFACTURING SEMICONDUCTOR DEVICES HAVING HIGH PRESSURE ANNEAL

TECHNICAL FIELD OF THE INVENTION

The present invention is directed, in general, to a method of annealing a semiconductor device at high pressure and, more specifically, to a method of conducting a high pressure anneal employing a hydrogen isotope.

BACKGROUND OF THE INVENTION

The use of silicon in devices, such as thin film metal oxide field effect transistors (MOSFETs), is well known. Equally well known is the performance degradation of these devices that occurs with time. It is believed that this efficiency degradation is caused, in part, by hot carriers conducting through the channel region from source to drain. Hot carriers are electrons or holes that have high kinetic energy, which is imparted to them when voltages are applied to electrodes of the device and between the source and drain. Thus, defects within the device may arise from current flow within the device over a period of time. It is further believed that these defects reduce the mobility and lifetime of the carriers and cause degradation of the device's performance. The hot carriers impact with silicon hydrogen (Si—H) bonds at a silicon dioxide/silicon ($SiO_2$/Si) interface. Once the Si—H bonds are broken, the silicon dangling bonds at the interface form interfacial trap defects that reduce mobility and silicon dioxide lifetimes. To alleviate the problems caused by such dangling bonds, a hydrogen passivation process has been adopted and has become a well-known and established practice in the fabrication of such devices.

During the hydrogen passivation process, it is thought that the defects that affect the operation of semiconductor devices are removed when the hydrogen bonds with the silicon at the dangling bond sites. While the hydrogen passivation process eliminates the immediate problems associated with these dangling bonds, it does not eliminate degradation permanently because the hydrogen atoms that are added by the passivation process can be "desorbed" or removed from the previous dangling bond sites by processing conditions or by the current flow. Under such operating conditions, the hydrogen atoms, which were added by the hydrogen passivation process, can be knocked off by the processing conditions or hot carriers. This hydrogen desorption results in aging or degradation of the device's performance.

For example, during the manufacturing process, the device may be passivated with hydrogen. However, in some instances, the hydrogen may be driven off by subsequent anneal steps that may be conducted on the device. Additionally, as mentioned above, it is believed that the hot carrier flow through the device is another reason for the efficiency degradation of the above-mentioned devices. Under regular operating conditions, the hydrogen atoms, which were added by the hydrogen passivation process, are knocked off by charge carriers, and result in aging or degradation of the device's performance. The performance of the device decreases with exposure to radiation or an electric field, which limits the useful life of the device. Moreover, since the $SiO_2$/Si or dielectric/silicon interface is formed at a very early stage of processing, the hydrogen has to diffuse through many layers of material before reaching the $SiO_2$/Si interface. Thus, it is inefficient to do a hydrogen anneal.

To combat the problems associated with the use of hydrogen, the semiconductor manufacturing industry has most recently discovered that deuterium provides certain advantages over hydrogen. Because of its greater mass, deuterium atoms are not as easily removed by hot carrier flow, yet at the same time, they provide the passivation necessary to prevent or inhibit the degradation of the device. Thus, deuterium is believed to be a very good substitute for hydrogen. Unfortunately, however, it is believed that deuterium may diffuse much slower than the hydrogen, which requires a longer annealing time at added cost. In such instances, it is believed that there will still be an unacceptable loss of deuterium after the device's final anneal due to the fact that deuterium may be driven from the critical interfaces by the high temperatures associated with annealing processes.

Accordingly, what is needed in the art is a method of manufacturing a semiconductor device that provides a method of passivation such that the device does not experience levels of efficiency degradation associated with conventional processes. The present invention addresses these needs.

SUMMARY OF THE INVENTION

To address the above-discussed deficiencies of the prior art, the present invention provides a method of passivating a semiconductor device having a capping layer formed thereover, comprising: (1) subjecting the semiconductor device to a high pressure and (2) exposing the semiconductor device to a passivating gas comprising a hydrogen isotope. The high pressure causes the passivating gas, such as a deuterated passivating gas, to penetrate the capping layer and thereby passivate the semiconductor device. The method provided by the present invention is, therefore, particularly useful in those instances where a final passivation step is desired after the formation of the capping layer. It is believed that the hydrogen isotope, bonds to dangling bond sites within the semiconductor device, which are most often present at a silicon/silicon dioxide interface. Further, because of their larger mass, these hydrogen isotope atoms are not easily removed by electron flow during the operation of the device as is the case with the lighter hydrogen atoms.

Thus, the present invention, in a broad scope, provides a method of passivating a semiconductor device through a capping layer with a material that not only occupies dangling bond sites and reduces the effects of hot carrier electron degredation, but is also less susceptible to removal during operation of the device.

In one particularly advantageous embodiment, the semiconductor device is subjected to a pressure greater than about 10 atmospheres. In a more advantageous embodiment, the semiconductor device is subjected to a pressure ranging from about 10 atmospheres to about 30 atmospheres. However, the passivation pressure may vary, depending on factors like the thickness of the barrier cap, the temperature used during the passivation process and the duration of the passivation process.

In another aspect of the present invention, subjecting the semiconductor device to a high pressure includes subjecting the semiconductor device to a high pressure at a temperature of less than about 400° C. In certain embodiments, the semiconductor device is subjected to a high pressure or a temperature of less than about 400° C. for a period of about 10 minutes. In other embodiments the semiconductor device is subjected to either or both for a period greater than 10 minutes.

A method of manufacturing a semiconductor device having a capping layer formed thereover is also provided. In this embodiment the method includes: (1) forming transistors on a semiconductor wafer, (2) forming interconnect layers, and electrically connecting the interconnect layers with the transistors to form an integrated circuit (IC), (3) forming a capping layer over the interconnect layers, and (4) passivating the semiconductor device with a passivating gas at a high pressure to cause the passivating gas to penetrate the capping layer and thereby passivate the semiconductor device.

In another aspect of the invention the semiconductor device may be a CMOS device, a BiCMOS device, a Logic, an analog device, a Bipolar device, a DRAM device or a FLASH integrated circuit. In other embodiments of the invention the transistors have a silicon/silicon dioxide or silicon/oxynitride interface, the capping layer comprises silicon nitride (SiN) and the capping layer is formed over an outermost layer of the semiconductor device.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
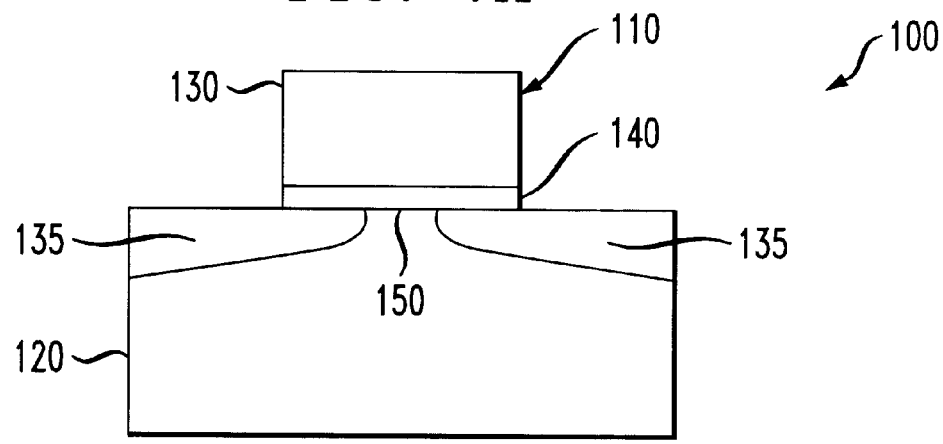
FIG. 1A illustrates a partial sectional view a conventional transistor.

Referring initially to FIG. 1A there is illustrated a partial sectional view of a conventionally formed transistor 100. The transistor 100 has a conventional gate electrode structure 110 formed over a substrate 120. The gate electrode structure 110 consists of a conventionally formed gate 130 and a gate dielectric layer 140, such an oxide or oxynitride. In most cases, as is known by one having skill in the art, the substrate 120, as well as other structures within the device (i.e. the gate 130), comprise silicon. Because of the silicon present in the substrate 120, a silicon/silicon dioxide ($SiO_2$) interface 150 is formed between the gate dielectric 140 and the silicon surface of the substrate 120.

Figure 1B:
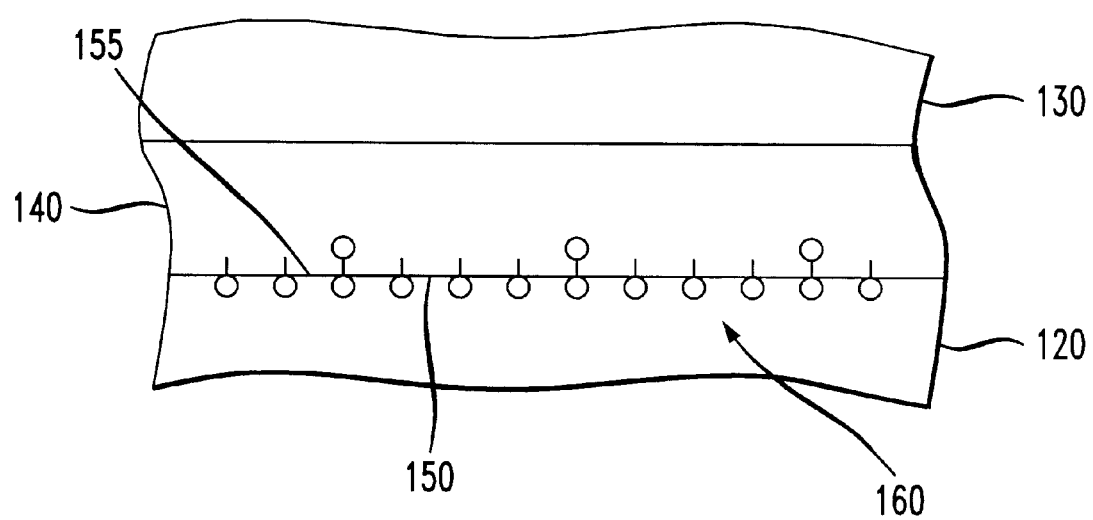
FIG. 1B illustrates a close-up view of the transistor of FIG. 1A and the silicon/silicon dioxide or silicon/oxynitride interface at which dangling bond site might occur.

It is at this interface that dangling bonds (unsaturated silicon bonds) may occur. It should be noted, however, that dangling bonds may occur anywhere within a semiconductor device where a silicon atom is unsaturated. FIG. 1B illustrates dangling bonds 160 present at the upper and lower $SiO_2$ interfaces 155, 150 in the transistor 100. The hot carriers in the channel region between source/drain regions 135 impact Si—H or silicon deuterium (Si—D) bonds, knocking off hydrogen or deuterium atoms, which leaves behind silicon dangling bonds and degrades the device's speed and lifetime.

Figure 2:
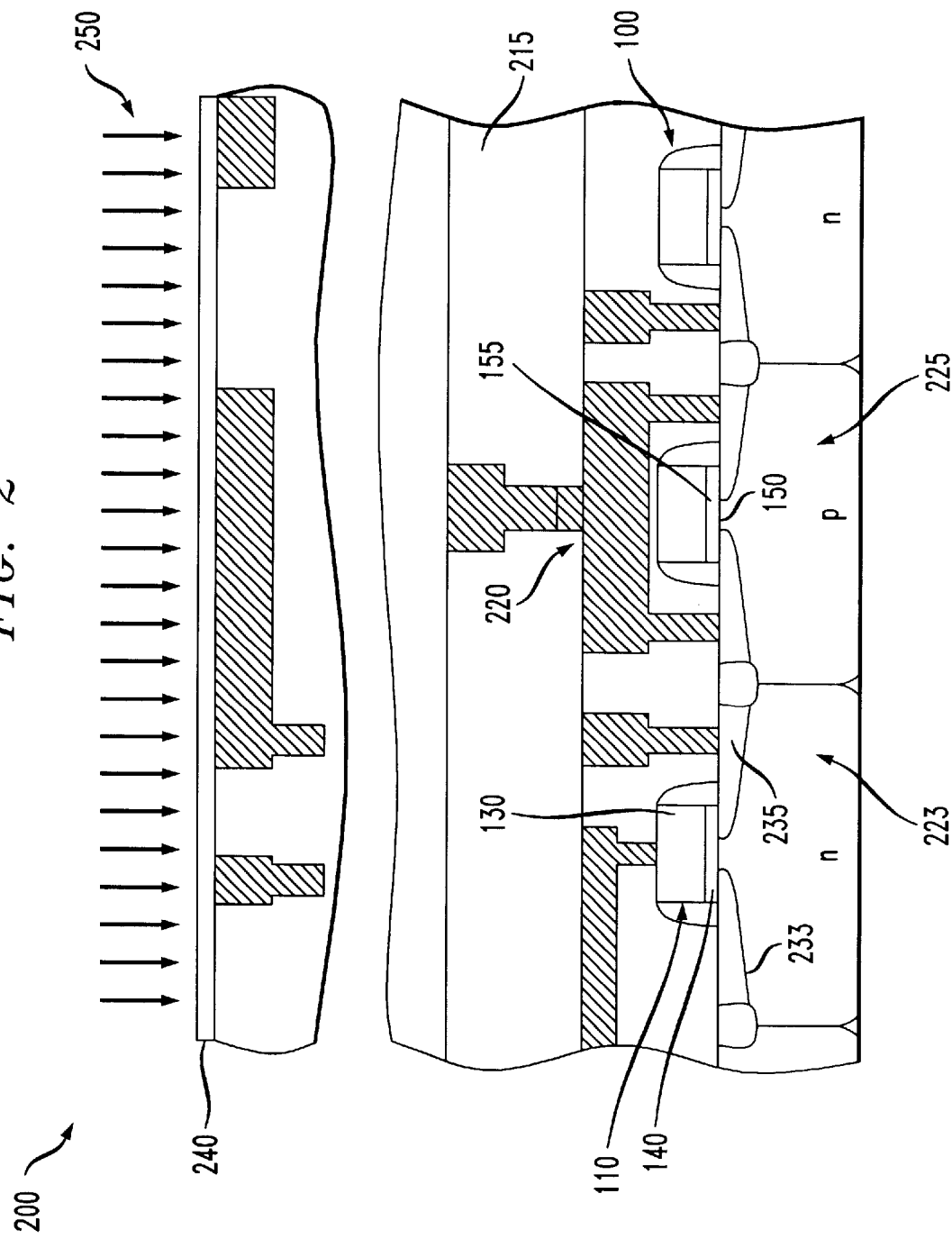
FIG. 2 illustrates a partial sectional view of a semiconductor device which might be passivated in accordance with the principles of the present invention.

Referring now to FIG. 2, there is illustrated a sectional view of a conventional semiconductor device 200 that might be passivated according to the principles of the present invention. The semiconductor device 200 may be a CMOS device, a BiCMOS device, a Logic, an analog device, a Bipolar device, a DRAM device or a FLASH device or other type of integrated circuit in which dangling bonds might occur. Shown in FIG. 2 are components of the conventional semiconductor device 200, including: the transistors 100, dielectric layers 215 in which interconnect structures 220 are formed (together forming interconnect layers), the interconnect structures 220 connecting the transistors 100 to other areas of the semiconductor device 200, conventionally formed tubs, 223, 225, source regions 233 and drain regions 235. Also illustrated in FIG. 2 are the upper and lower $SiO_2$ interfaces 155, 150 at which dangling bonds site may be present. A conventional capping layer 240, which may be comprised of silicon nitride (SiN), is also shown.

In most cases, the capping layer 240 will be formed on the semiconductor device's outermost dielectric layer. It should be understood, however, that the capping layer 240 may be present at other, lower levels within the semiconductor device 200. The capping layer 240 posses particular problems when passivating the semiconductor device 200 after its formation. While hydrogen easily diffuses through the capping layer 240 at atmospheric pressure, isotopes of hydrogen, such as deuterium, do not diffuse through the capping layer 240 due to its greater mass. Elevating the passivation temperature was found to be unacceptable because of the presence of metal interconnect structures within the semiconductor device 200. However, it is believed that at high pressures the hydrogen isotope will easily diffuse through the capping layer 240 and into and throughout the semiconductor device 200 at temperatures that will not affect the metal interconnect structures.

Thus, in the present invention, the semiconductor device 200 is subjected to a high pressure passivation process using a passivating gas 250 that includes a hydrogen isotope (i.e. a hydrogen atom having one or more neutrons in its nucleus). To perform such a passivating process, the semiconductor device 200 is placed within a pressure chamber and subjected to the passivating gas 250 while under a high pressure. The high pressure at which the process may proceed may vary, but it could be any pressure over atmospheric pressure at which the hydrogen isotope will diffuse through the capping layer 240. For example, one embodiment has the passivation process taking place at a pressure greater than 10 atmospheres. However, in a preferred embodiment the passivation process occurs at a pressure between about 10 atmospheres and 30 atmospheres and most preferably at a pressure of 25 atmospheres. The time during which the passivation process may be conducted, may vary depending on the pressure used. However, in one particularly advantageous embodiment, the semiconductor device 200 may be subjected to the passivation process for about 10 minutes.

In conventional processes, passivation was conducted at a temperature of about 425° C. and atmospheric pressure. However, due to the increase in pressure in the passivation process, the temperature and time of the current process may be advantageously reduced. In one embodiment, passivation process may be conducted at a temperature of less than about 400° C. This allows the semiconductor device 200 to be subjected to the passivation process without subjecting any metal interconnect structures to high temperatures, which may cause damage. One having skill in the art knows that the process parameters set out may be combined to produce the most optimum conditions for the hydrogen isotope passivation process.

During the high pressure passivation process, the hydrogen isotope is diffused through the capping layer 240 and through the semiconductor device 200. It is believed that the hydrogen isotope atoms not only bond to the dangling bonds present in the upper $SiO_2$ interface 155 and lower $SiO_2$ interface 150 and thereby eliminate dangling bond sites that can give rise to hot carrier electron degredation, but the diffused hydrogen isotope forms a hydrogen isotope diffusion gradient in a region underlying the capping layer 240. It should be noted that the hydrogen isotope may also similarly bond to other dangling bond site in other portions of the semiconductor device 200, thereby overall providing for a more robust device. Once the hydrogen isotope atoms have bonded to the dangling bonds, the weight of the hydrogen isotope atoms prevent processing conditions and electron flow from removing the hydrogen isotope atoms from the semiconductor device 200.

Although the present invention has been described in detail, those skilled in the art should understand that they can make various changes, substitutions and alterations herein without departing from the spirit and scope of the invention in its broadest form.

What is claimed is:

1. A method of passivating a semiconductor device, comprising:
    subjecting a semiconductor device to a high pressure; and
    penetrating a capping layer of the semiconductor device with a passivating gas comprising a hydrogen isotope under the high pressure.

2. The method as recited in claim 1 wherein subjecting includes subjecting the semiconductor device to a pressure greater than about 10 atmospheres.

3. The method as recited in claim 2 wherein subjecting includes subjecting the semiconductor device to a pressure ranging from about 10 atmospheres to about 30 atmospheres.

4. The method as recited in claim 1 wherein subjecting includes subjecting the semiconductor device to a high pressure at a temperature of less than about 400° C.

5. The method as recited in claim 1 wherein exposing the semiconductor device to a passivating gas includes exposing the semiconductor device to a deuterated passivating gas.

6. The method as recited in claim 1 wherein exposing the semiconductor device to a passivating gas includes exposing the semiconductor device to the passivating gas for a period of about 10 minutes.

7. The method as recited in claim 1 wherein exposing the semiconductor device to a passivating gas includes exposing the semiconductor device to a deuterated passivating gas at a pressure ranging from about 10 atmospheres to about 30 atmospheres at a temperature of less than about 400° C.

8. The method as recited in claim 7 wherein exposing the semiconductor device to a passivating gas includes exposing the semiconductor device to the passivating gas at the high pressure for a period of greater than about 10 minutes.

9. The method as recited in claim 1 wherein exposing the semiconductor device to a passivating gas includes exposing the semiconductor device to the passivating gas to cause the hydrogen isotope to bond to dangling bond sites within the semiconductor device.

10. The method as recited in claim 9 wherein the dangling bond sites are located at a silicon/silicon dioxide interface.

11. A method of manufacturing a semiconductor device, comprising:
    forming transistors over a semiconductor substrate;
    forming interconnect layers, and electrically connecting the interconnect layers with the transistors to form an integrated circuit (IC);
    forming a capping layer over the interconnect layers; and
    passivating the semiconductor device with a passivating gas at a high pressure to cause the passivating gas to penetrate the capping layer and thereby passivate the semiconductor device.

12. The method as recited in claim 11 wherein forming transistors includes forming transistors having a silicon/silicon dioxide interface.

13. The method as recited in claim 11 wherein forming a capping layer includes forming a capping layer comprising silicon nitride (SiN).

14. The method as recited in claim 11 wherein forming a capping layer includes forming a capping layer over an outermost layer of the semiconductor device.

15. The method as recited in claim 11 wherein passivating includes passivating the semiconductor device to a pressure greater than about 10 atmospheres.

16. The method as recited in claim 15 wherein subjecting includes subjecting the semiconductor device to a pressure ranging from about 10 atmospheres to about 30 atmospheres.

17. The method as recited in claim 11 wherein subjecting includes subjecting the semiconductor device to a high pressure at a temperature of less than about 400° C.

18. The method as recited in claim 11 wherein passivating includes exposing the semiconductor device to a deuterated passivating gas.

19. The method as recited in claim 11 wherein passivating includes exposing the semiconductor device to the passivating gas for a period of about 10 minutes.

20. The method as recited in claim 11 wherein passivating includes exposing the semiconductor device to a deuterated passivating gas at a pressure ranging from about 10 atmospheres to about 30 atmospheres at a temperature of less than about 400° C.

21. The method as recited in claim 20 wherein passivating includes exposing the semiconductor device to the passivating gas at the high pressure for a period of greater than about 10 minutes.

22. The method as recited in claim 11 wherein passivating includes exposing the semiconductor device to a passivating gas to cause the hydrogen isotope to penetrate the capping layer, diffuse through the interconnect layers and bond to dangling bond sites within the semiconductor device.

23. The method as recited in claim 22 wherein the dangling bond sites are located at silicon/silicon dioxide interfaces of the transistors.

24. The method as recited in claim 11 further comprising manufacturing a semiconductor device selected from the group:
    a CMOS device,
    a BiCMOS device,
    a Logic device,
    an analog device,
    a Bipolar device
    a DRAM device, and
    a FLASH integrated circuit.

* * * * *